United States Patent
Kessler

(10) Patent No.: US 10,670,658 B2
(45) Date of Patent: Jun. 2, 2020

(54) ARRANGEMENT AND METHOD FOR DETECTING AN ELECTRICAL LINE INTERRUPTION DURING OPERATION OF A DRIVE SYSTEM

(71) Applicant: Conti Temic microelectronic GmbH, Nuremberg (DE)

(72) Inventor: Erwin Kessler, Bad Saulgau (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 51 days.

(21) Appl. No.: 15/767,408

(22) PCT Filed: Sep. 21, 2016

(86) PCT No.: PCT/EP2016/072472
§ 371 (c)(1),
(2) Date: Apr. 11, 2018

(87) PCT Pub. No.: WO2017/063834
PCT Pub. Date: Apr. 20, 2017

(65) Prior Publication Data
US 2018/0313897 A1    Nov. 1, 2018

(30) Foreign Application Priority Data

Oct. 15, 2015   (DE) .......................... 10 2015 220 020

(51) Int. Cl.
*G01R 31/34* (2006.01)
*H02P 5/68* (2006.01)
(Continued)

(52) U.S. Cl.
CPC .............. *G01R 31/343* (2013.01); *H02P 5/68* (2013.01); *H02P 5/69* (2013.01); *H02P 7/06* (2013.01);
(Continued)

(58) Field of Classification Search
CPC ....................................................... H02P 5/69
See application file for complete search history.

(56) References Cited

U.S. PATENT DOCUMENTS

2014/0054103 A1*   2/2014   Kezobo ................ B62D 5/0487
                                                    180/446

FOREIGN PATENT DOCUMENTS

DE    102005047089 A1    4/2007
DE    102008053113 A1    5/2010
(Continued)

OTHER PUBLICATIONS

Office Action dated Oct. 12, 2016 from corresponding German Patent Application No. 10 2015 220 020.5.
(Continued)

*Primary Examiner* — Jas A Sanghera

(57) ABSTRACT

The invention relates to an arrangement for identifying an electrical line interruption during operation of a drive system (20), which comprises two parallel-connected DC motors (21, 41), which are mechanically coupled to one another by means of a part that is to be driven, a driver for driving the two parallel-connected DC motors (21, 41) and a measuring device for detecting different electrical variables of the drive system (20). The measuring device comprises a rotational speed determination apparatus (32) for determining the rotational speed of the two DC motors (21, 41) and for supplying a piece of rotational speed information representing the rotational speed. The measuring device further comprises a current measuring apparatus (27; 28) for determining a summation current flowing in the two DC motors (21, 41) and for supplying a piece of current information representing the summation current and a voltage determination apparatus (60; 61) for determining the terminal voltage of the two DC motors (21, 41) and for supplying a piece of voltage information representing the terminal volt-
(Continued)

age. A computation unit (70) is designed to ascertain a motor parameter ($k_\omega$) for the drive system (20) from the voltage information, the current information and the rotational speed information and to compare said motor parameter with a setpoint value ($k_{\omega\_set}$) of the motor parameter ($k_\omega$), wherein the presence of a line interruption to one of the two DC motors (21, 41) can be inferred from the result of the comparison.

16 Claims, 4 Drawing Sheets

(51) Int. Cl.
- *H02P 7/24* (2006.01)
- *H02P 29/024* (2016.01)
- *H02P 5/69* (2006.01)
- *H02P 7/06* (2006.01)

(52) U.S. Cl.
CPC .......... *H02P 7/245* (2013.01); *H02P 29/0241* (2016.02)

(56) References Cited

FOREIGN PATENT DOCUMENTS

| | | |
|---|---|---|
| DE | 102009054107 A1 | 5/2011 |
| DE | 102010060102 A1 | 4/2012 |

OTHER PUBLICATIONS

International Search Report and Written Opinion dated Dec. 15, 2016 from corresponding International Patent Application No. PCT/EP2016/072472.

\* cited by examiner

ARRANGEMENT AND METHOD FOR DETECTING AN ELECTRICAL LINE INTERRUPTION DURING OPERATION OF A DRIVE SYSTEM

The invention relates to an arrangement and a method for identifying an electrical line interruption during operation of a drive system, which comprises two parallel-connected DC motors, which are mechanically coupled to one another by means of a part that is to be driven, a driver for driving the two parallel-connected DC motors and a measuring device for detecting different electrical variables of the drive system.

In some drive systems, it is necessary to drive a part that is to be driven by means of two electric motors that are fixedly connected to one another by means of the part that is to be driven or another mechanical element. It may then be necessary to divide the drive over two drive motors operated mechanically in parallel when the installation space for an individual, sufficiently powerful drive motor is not available, for example. A further reason for the parallel operation of two drive motors may be insufficient torsional rigidity of the part that is to be driven.

The part that is to be driven, which exhibits the aforementioned requirements, may be a tailgate of a vehicle, for example, which can be opened or closed with the aid of the drive system without a user exerting force.

Drive systems formed in this way have the feature that, in the event of a failure of one of the drive motors, for example on account of an interruption in a motor line, the drive system continues to be driven by way of the remaining drive motor. In this case, the drive motor that is not supplied with current is also moved by the driving drive motor on account of the mechanical coupling of the two motors. This means that the remaining active drive motor takes over the entire load in this fault event. This introduces the problem that the remaining active electric motor may become overloaded.

In drive systems, such as those used, for example, for driving hatches (in particular tailgates) in a vehicle, the motor speed (rotational speed) of the drive motors is monitored. However, the monitoring of the motor speed in itself is not sufficient information to recognize the failure of one of the two drive motors. The reason for this is the mechanical coupling of the two drive motors by means of the part that is to be driven, such that, even in the case of failure of one of the drive motors, the drive shaft thereof is driven by the remaining active drive motor and, as a result, a rotational speed signal for the failed drive motor is retained. Moreover, there is the additional difficulty that the activation times can be very short in some drive systems. The activation time for the operation of hatches in motor vehicles is only a few seconds, for example. Moreover, the motor load can also vary significantly, for example due to ice or snow on the hatch.

An electrical line interruption in a drive system is identified in known solutions by virtue of the fact that the current flowing through the drive motors is measured independently of one another. The line interruption is identified by means of the evaluation, that is to say the comparison, of the measured motor currents.

Alternatively, arrangements are known in which, in the rest state of the system, that is to say when the drive motors are not energized, a voltage is applied to a motor connection, wherein the second motor connection of the same drive motor is set to an alternative potential by means of a resistor. By evaluating the voltage potentials of the voltage divider formed by means of the connections of the respective drive motor, a line interruption can then be identified.

These variants are used in drive systems in which a separate driver stage is provided for each electric motor.

Since the provision of respective drivers for the two drive motors is associated with costs, drive systems in which the two drive motors are supplied with power using just one single driver have been developed. In this case, the drive motors are connected in parallel. In an arrangement of this kind, a current measurement is carried out in each motor feed line, wherein the line interruption is identified by means of the comparison of the measured motor currents. The variant of the line interruption in the rest state of the system by means of voltage measurement described above is not possible in this drive system.

A disadvantage of the described variants consists in the fact that a current measuring apparatus has to be provided in each line to the drive motor when identifying the line interruption by means of current measurement. Since the hardware required for the current measurement is associated with a high level of outlay, the arrangements are relatively complex and disadvantageous on account of the associated costs for mass use, in particular in the field of motor vehicles.

It is the object of the invention to specify an arrangement and a method for identifying an electrical line interruption during operation of a drive system, said arrangement and method being able to be provided in a structurally and/or functionally improved and more cost-effective manner.

Said objects are achieved by way of an arrangement in accordance with the features of claim 1 and also by way of a method in accordance with the features of claim 12. Advantageous configurations are evident from the dependent claims.

In accordance with a first aspect, an arrangement for identifying an electrical line interruption during operation of a drive system is proposed. The drive system comprises two parallel-connected DC motors as drive motors, which DC motors are mechanically coupled to one another by means of a part that is to be driven. The two parallel-connected DC motors are preferably of the same design and the same physical size. The DC motors may be, for example, spindle motors. The drive system further comprises a driver for driving the two parallel-connected DC motors and a measuring device for detecting different electrical variables of the drive system.

The arrangement is characterized in that the measuring device comprises a rotational speed determination apparatus, a current measuring apparatus and a voltage determination apparatus. The rotational speed determination apparatus serves for determining the rotational speed of the two DC motors, wherein the rotational speed determination apparatus is designed to supply a piece of rotational speed information representing the rotational speed to a computation unit. The current measuring apparatus serves for determining a summation current flowing into the DC motors, wherein the current measuring apparatus is designed to supply a piece of current information representing the summation current to the computation unit. The voltage determination apparatus serves for determining the terminal voltage of the two DC motors, wherein the voltage determination apparatus is designed to supply a piece of voltage information representing the terminal voltage to the computation unit.

The computation unit of the arrangement is designed to ascertain a motor parameter for the drive system from the voltage information, the current information and the rotational speed information and to compare said motor parameter with a setpoint value of the motor parameter. The presence of a line interruption to one of the two DC motors can be inferred from the result of the comparison.

The proposed arrangement manages with a lower number of components in comparison with the known arrangements. On account of the parallel-connected DC motors, only one common driver is therefore required to drive the two parallel-connected DC motors. Since the current measuring apparatus determines the summation current flowing in the two DC motors, the arrangement manages with just one single current measuring apparatus. As a result, the arrangement can thereby be provided in a simpler and more cost-effective manner.

In accordance with one configuration, the computation unit is designed to ascertain the motor parameter in accordance with the formula $$k_\omega = \frac{U_{KL} - \frac{I_{Sum}}{2} \cdot R_a}{\omega}$$

wherein $U_{KL}$ is the terminal voltage, $I_{Sum}$ is the summation current, $R_a$ is the armature resistance of the DC motors and $\omega$ is the rotational speed. In this case, the terminal voltage represents the voltage information mentioned at the outset, the summation current represents the current information mentioned at the outset and the rotational speed represents the rotational speed information mentioned at the outset. The actual motor parameter can be ascertained based on the given formula, said actual motor parameter then being able to be compared with the setpoint value of the motor parameter known to the computation unit.

In accordance with a further configuration, the computation unit is designed to infer the presence of a line interruption when the ascertained motor parameter is lower than the setpoint value of the motor parameter.

The setpoint value of the motor parameter can be derived from the parameters specified in the motor datasheet.

The computation unit is expediently further designed to infer the presence of the operation of the drive system as intended when the ascertained motor parameter corresponds to the setpoint value of the motor parameter or is within a prescribed tolerance range around the setpoint value.

In accordance with a further configuration, the computation unit is further designed to read out the setpoint value of the motor parameter from a memory of the computation unit. The setpoint value of the motor parameter can be entered into the memory of the computation unit, for example, before start-up of the arrangement. In this case, the setpoint value of the motor parameter is a fixed, unchanging value, which is ascertained, for example, by means of the data in the motor datasheet of the DC motor. Since the two parallel-connected DC motors in the described arrangement are of the same kind and the same type, the setpoint values of the motor parameter for both DC motors can also be seen as the same.

Alternatively, the setpoint value of the motor parameter can be a value that is determined and adapted during operation of the drive system. By way of example, the setpoint value of the motor parameter can be ascertained based on an unknown positive case during manufacture of the arrangement and can be stored in the memory. Alternatively, the setpoint value of the motor parameter can be adjusted for each movement proceeding from an actual value, for example a prescribed standard value. If an adjustment of this kind comprises a comparatively large change of this kind, a fault event can be inferred. Using this variant, it is possible to take into account, for example, aging and/or heating of the components of the arrangement.

In accordance with a further configuration, the current measuring apparatus comprises a measuring shunt and a first voltage measuring means for detecting the voltage dropped across the measuring shunt, wherein the measuring shunt is interconnected between a first node, at which respective first terminals of the two parallel-connected DC motors are connected, and a first driver output. This arrangement permits the intended ascertainment of the summation current for supplying the current information.

In accordance with a further configuration, the voltage measuring apparatus comprises a second voltage measuring means, which is coupled to the first node to detect a first voltage applied to the first node, and a third voltage measuring means, which is coupled to a second node to which respective second terminals of the two parallel-connected DC motors are connected to detect a second voltage applied to the second node, wherein the terminal voltage can be ascertained from the difference between the first and the second voltage. The voltage measuring means are therefore provided at the two terminals of the parallel-connected DC motors for ascertaining the terminal voltage. On account of the parallel connection of the DC motors and the described arrangement of the voltage measuring means, the terminal voltage is even ascertained when one of the two DC motors has a fault.

In accordance with a further configuration, the rotational speed determination apparatus comprises a single sensor, in particular a Hall sensor, at a drive shaft of the two DC motors.

The part that is to be driven is, in particular, a hatch of a vehicle, in particular of a motor vehicle. The hatch is, for example, a luggage compartment cover of the motor vehicle.

In accordance with a second aspect of the invention, a method for identifying an electrical line interruption during operation of a drive system is proposed. The drive system comprises two parallel-connected DC motors, which are mechanically coupled to one another by means of a part that is to be driven, a driver for driving the two parallel-connected DC motors and a measuring device for detecting different electrical variables of the drive system.

In the method, the following steps are carried out. A rotational speed determination apparatus of the measuring device determines a rotational speed of the two DC motors and supplies a piece of rotational speed information representing the rotational speed to a computation unit. A current measuring apparatus of the measuring device determines a summation current flowing into the two DC motors and supplies a piece of current information representing the summation current to the computation unit. A voltage determination apparatus of the measuring device determines the terminal voltage of the two DC motors and supplies a piece of voltage information representing the terminal voltage to the computation unit. The computation unit ascertains a motor parameter for the drive system from the voltage information, the current information and the rotational speed information and compares said motor parameter with a setpoint value of the motor parameter, wherein the presence of a line interruption to one of the two DC motors is inferred from the result of the comparison.

The method has the same advantages as have been explained above in connection with the described arrangement.

In accordance with one configuration of the method, the computation unit ascertains the motor parameters according to the formula $$k_\omega = \frac{U_{KL} - \frac{I_{Sum}}{2} \cdot R_a}{\omega}$$

wherein $U_{KL}$ is the terminal voltage, $I_{Sum}$ is the summation current, $R_a$ is the armature resistance of the DC motors and $\omega$ is the rotational speed. It goes without saying that the rotational speeds $\omega$ of the two DC motors are equal on account of the mechanical coupling thereof.

In a further configuration, the computation unit infers the presence of a line interruption when the ascertained motor parameter is lower than the setpoint value of the motor parameter.

In another configuration, the computation unit infers the presence of the operation of the drive system as intended when the ascertained motor parameter corresponds to the setpoint value of the motor parameter or is within a prescribed tolerance range around the setpoint value.

In accordance with a further configuration, the computation unit reads out the setpoint value of the motor parameter from a memory of the computation unit.

The invention is described in greater detail below on the basis of an exemplary embodiment in the drawing.

Figure 4:
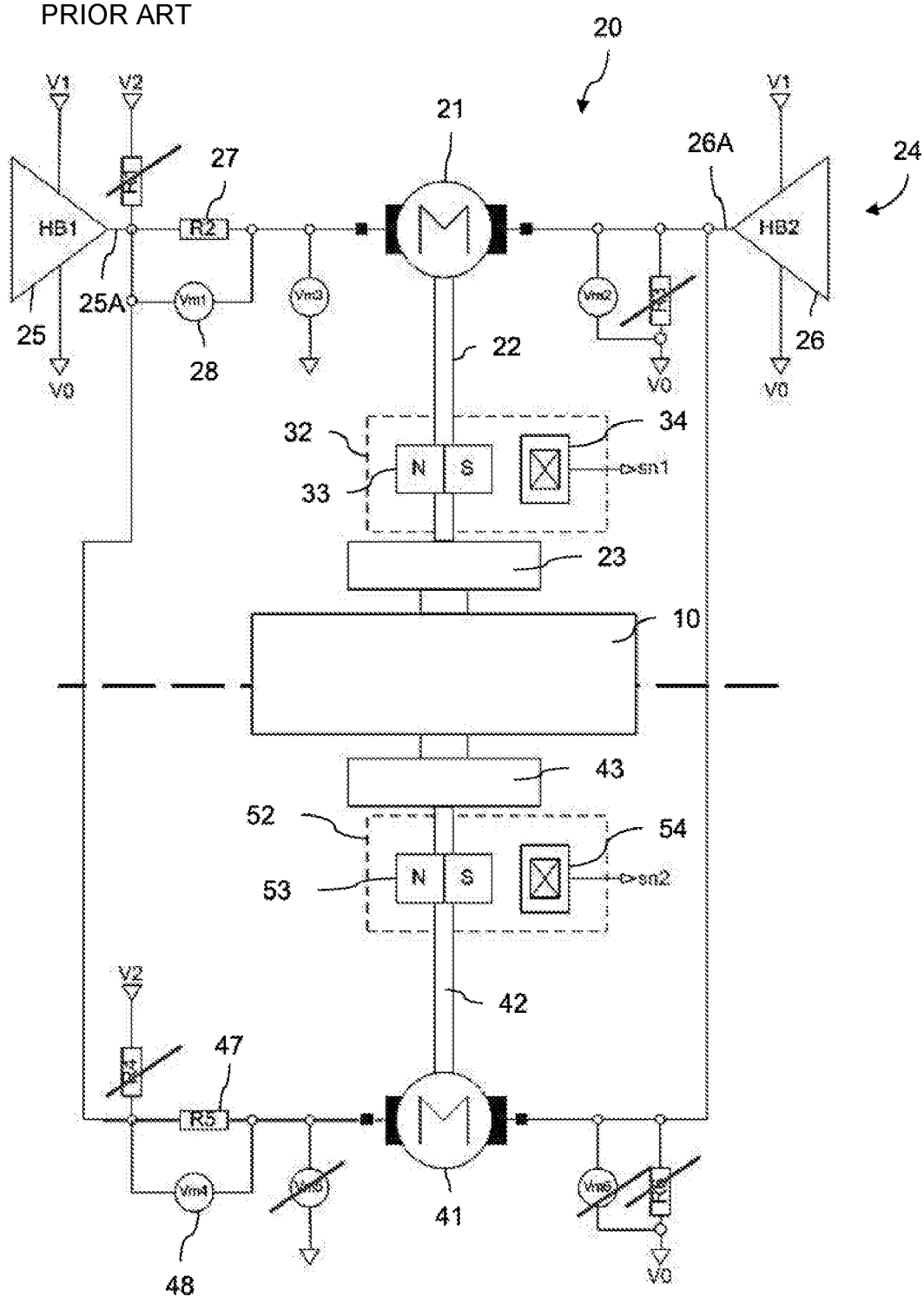
Figure 5:
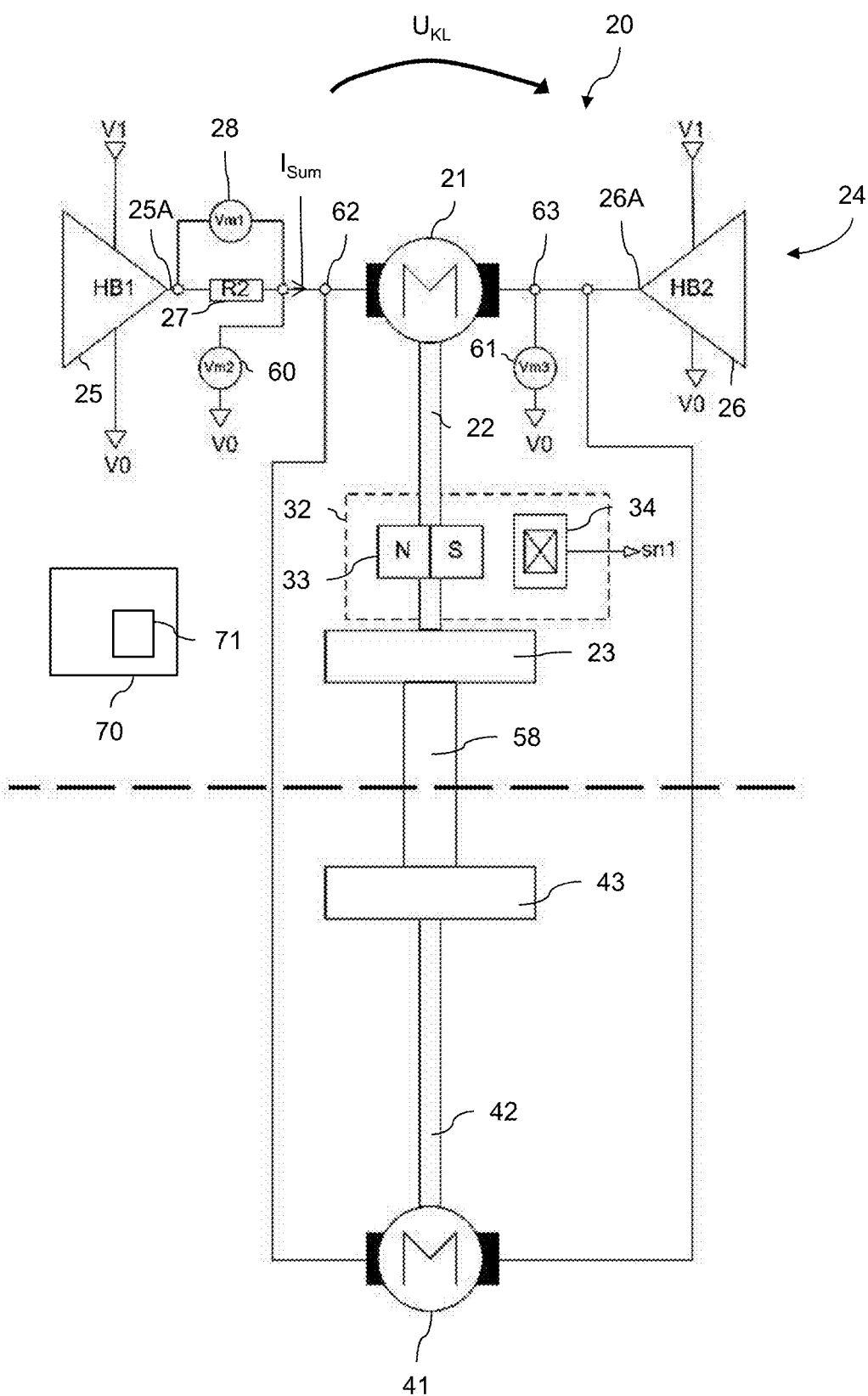

FIG. 4 shows a schematic illustration of a second electrical equivalent circuit diagram of an arrangement known from the prior art for identifying an electrical line interruption in a drive system; and FIG. 5 shows a schematic illustration of an electrical equivalent circuit diagram of an arrangement according to the invention for identifying an electrical line interruption during operation of an electrical drive system.

Figure 1:
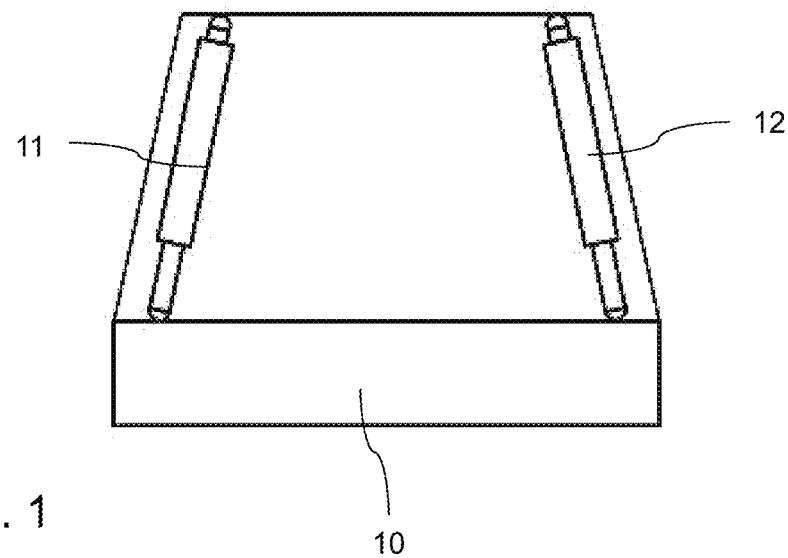
FIG. 1 shows a schematic illustration of a part that is to be driven by an arrangement according to the invention, said part being in the form of a tailgate of a vehicle.
Figure 2:
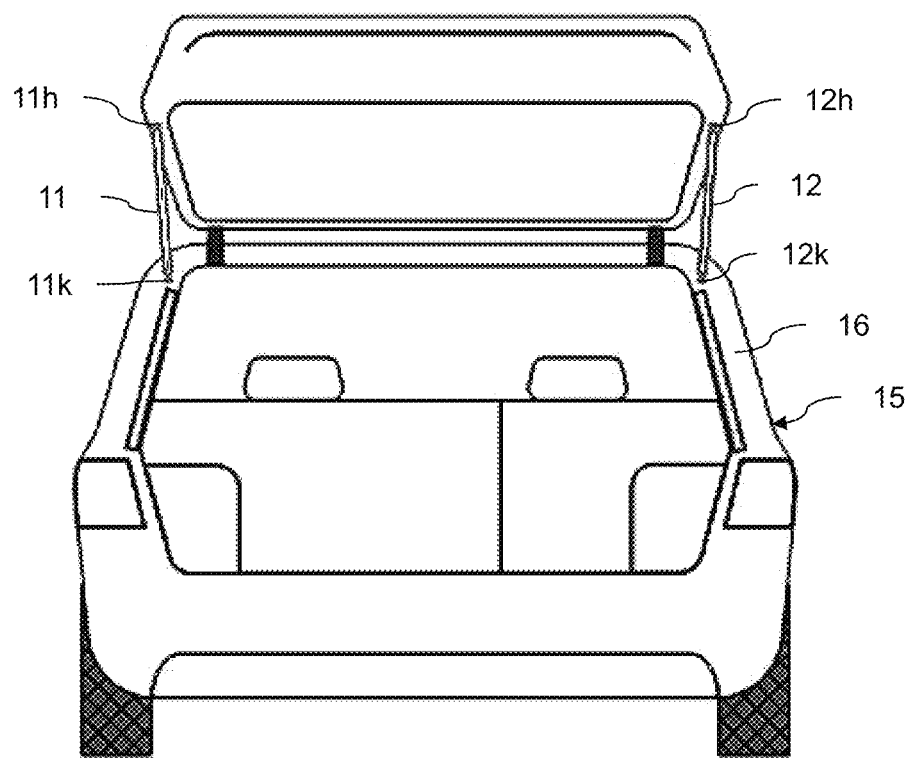
FIG. 2 shows a rear view of a motor vehicle with an open tailgate, which can be driven by an arrangement according to the invention.

FIGS. 1 and 2 show schematic illustrations of the intended use of a drive system consisting of two DC motors. FIG. 1 shows a schematic illustration of a tailgate 10 having a first actuator and a second actuator 12, which together form the drive system. The first actuator 11 and the second actuator 12 each comprise a DC motor of the drive system, which DC motors are mechanically coupled to one another by means of the tailgate 10. FIG. 2 shows a motor vehicle 15 from behind, wherein the tailgate 10 is open. It can be clearly seen here that one end 11h of the first actuator 11 is connected to the tailgate, whereas an end 11k of the first actuator 11 facing away from said tailgate is connected to the vehicle body 16 of the vehicle 15. In a corresponding manner, one end 12h of the second actuator 12 is connected to the tailgate 10 and an end 12k facing away from said tailgate is connected to the vehicle body 16 of the vehicle 15. By operating the drive system, the tailgate 10 of the vehicle 15 can be opened or closed automatically.

The DC motors used in this application are spindle motors, which move two partial pieces, which engage into each other, of the first and the second actuator 11, 12 relative to one another in the axial direction and make the relative movement of the tailgate 10 with respect to the vehicle body 16 possible as a result.

The two DC motors of the actuators 11, 12 are, as described, mechanically coupled to one another by means of the tailgate 10. This means that, in the event of failure of one of the two DC motors, the drive system continues to be driven by means of the remaining active DC motor. In this case, the DC motor that is not energized also moves on account of the mechanical coupling of the drive system by means of the tailgate 10. In the event of a fault, the remaining active DC motor takes over the entire load and may therefore become overloaded.

Figure 3:
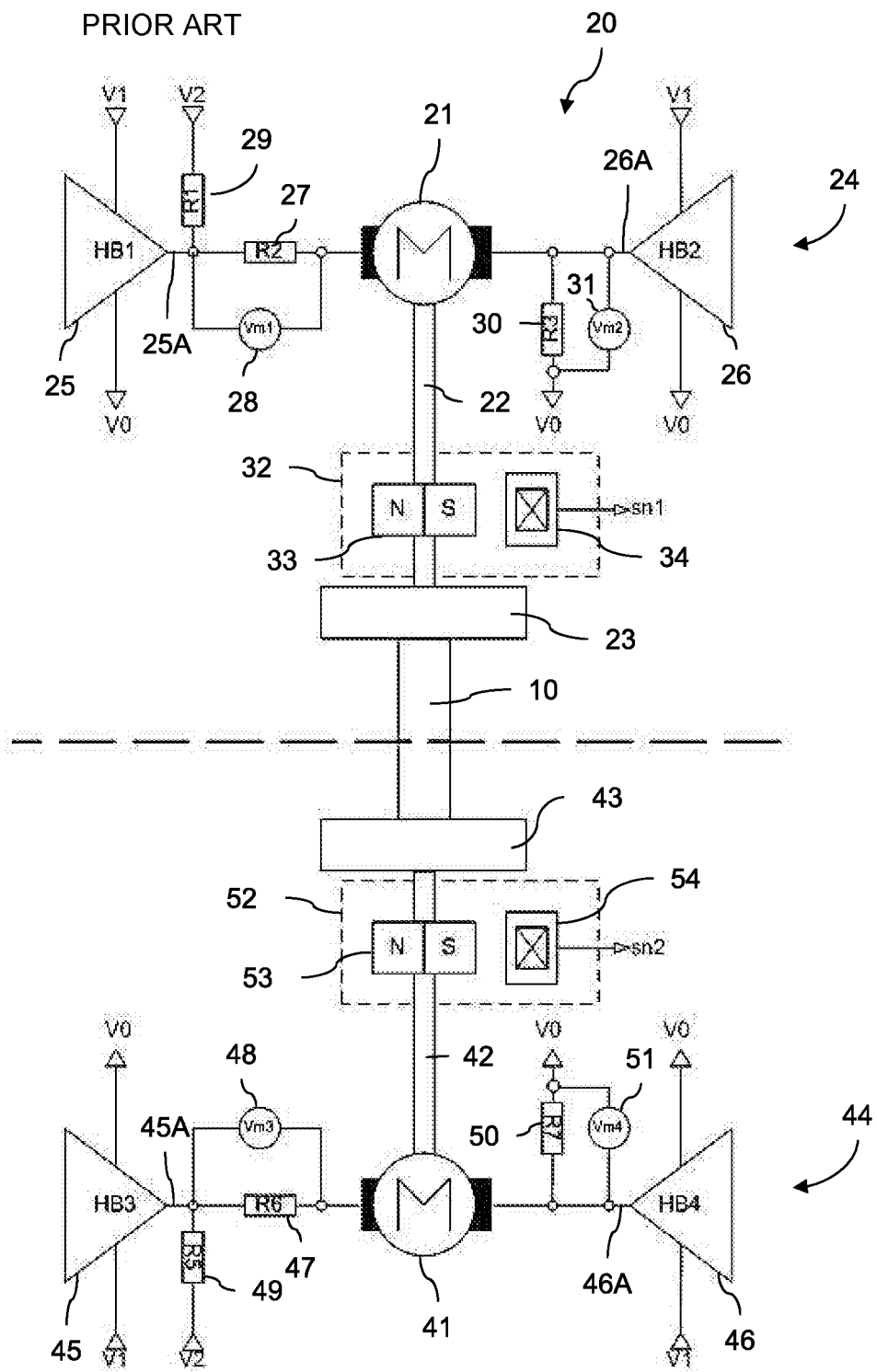
FIG. 3 shows a schematic illustration of a first electrical equivalent circuit diagram of an arrangement known from the prior art for identifying an electrical line interruption in a drive system.

FIGS. 3 and 4 each show known arrangements for identifying an electrical line interruption during operation of the drive system. A line interruption is present, for example, when one of the two DC motors fails, for example on account of an interruption in a motor feed line.

In the two drive systems shown in FIGS. 3 and 4, the DC motors 21, 41 are coupled to one another by means of respective shafts 22, 42 and transmissions 23, 43 having the part that is to be driven, that is to say the tailgate 10. The drive shafts 22, 42 are made to rotate in the same direction by the respectively associated DC motors 21, 41 upon energization thereof. The transmissions 23, 43 provided between the drive shafts 22, 42 and the tailgate 10 serve to perform a rotational speed transformation.

Each of the drive shafts 22, 42 is provided with a rotational speed determination apparatus 32, 52. These serve to determine the position of the tailgate 10 that is moved by the operation of the drive apparatus. The position is detected in this case by means of detection of the number of rotations and the direction of rotation of the drive shaft 22 and 42, respectively.

Each of the rotational speed determination apparatuses 32, 52 comprises a magnetic pole wheel 33 and 53, respectively, the magnetic field of which is evaluated by means of an associated Hall sensor 34 and 54, respectively. The rotational speed signal (sn1, sn2) emitted by the respective Hall sensor 34, 54 in this case represents a piece of rotational speed information for determining the position of the tailgate 10 that can be processed by a computation unit (not illustrated in any more detail).

In this respect, the design of the drive systems 20 in the arrangements of FIGS. 3 and 4 is described identically. The differences of the actuation and the identification of the electrical line interruption during operation of the drive system 20 are described below.

With reference to FIG. 3, it is readily apparent that, in the arrangement shown here, a separate driver 24 and 44, respectively, is associated with each of the DC motors 21, 41. The driver 24 comprises two driver stages 25, 26. The driver 44 comprises two driver stages 45 and 46. Respective outputs 25A and 26A of the driver stages 25, 26 are coupled or connected to the motor terminals of the DC motor 21. Corresponding driver outputs 45A, 46A of the driver stages 45, 46 are correspondingly coupled to the motor terminals of the DC motor 41. The DC motors 21, 41 are energized for operation thereof by means of said driver stages 25, 26 and 45, 46. A shunt resistor (measuring shunt) 27 is provided between the driver output 25A of the driver stage 25 and the associated motor terminal. The voltage dropped across the shunt resistor 27 during operation of the DC motor is ascertained by means of a voltage measuring means 28, as a result of which the magnitude of the current flowing through the DC motor 21 can be ascertained.

A corresponding measuring apparatus is also provided for the DC motor 41. In this case, a shunt resistor (measuring shunt) 47 is provided between the driver output 45A of the driver stage 45 and the associated terminal of the DC motor 41. The voltage dropped across the shunt resistor 47 is ascertained by means of a voltage measuring apparatus 48, as a result of which the current flowing through the DC motor 41 during operation thereof can be ascertained.

As a result, the current through the two DC motors 21, 41 is therefore measured independently of one another. A line interruption is identified in this case by means of the evaluation of the measured motor currents, which are fed to the computation unit (already mentioned and not illustrated further) for evaluation.

The arrangement of FIG. 3 is furthermore provided with a voltage determination apparatus, which can be used as an alternative or in addition to the described current measuring apparatus in order to be able to identify the line interruption in the rest state of the drive system 20. To this end, a resistor 29 is interconnected between a supply potential V2 and one motor terminal of the DC motor 21. A further resistor 30 is interconnected between the other motor terminal of the DC motor 21 and a reference potential V0. A voltage dropped across the resistor 30 is ascertained by means of a voltage measuring means 31. The resistors 29, 30 form a voltage divider (the voltage dropped across the shunt resistor 27 can be disregarded out of principle). If the two resistors 29, 30 have the same dimensions, a voltage that is half as great as the difference between the voltage potentials V2 and V0 is dropped across the resistor 30. In the case of a line interruption, the voltage ratios across the voltage divider change, as a result of which the voltage measuring means 31 can no longer ascertain a voltage since said voltage measuring means then has the reference potential V0.

A corresponding apparatus is also associated with the DC motor 41, wherein the voltage divider is formed by the resistors 49, 50 in this case. A voltage measuring means 51 is interconnected in parallel with the resistor 50. The resistor 49, which is coupled to one terminal of the DC motor 41, is supplied with a supply voltage V2, while the resistor 50, which is connected with its one end to the other motor terminal of the DC motor 41, is connected with its other connection to the reference potential V0. The voltage determination apparatuses can therefore evaluate the voltage potentials at the terminals of the DC motors 21, 41.

The ascertainment of the motor rotational speed by means of the rotational speed determination apparatuses 32, 52 as described above is not used or required to ascertain the line interruption.

In the further known exemplary embodiment shown in FIG. 4, the DC motors 21, 41 are connected in parallel, such that they can be energized by a single driver 24, which comprises the driver stages 25, 26. The current measuring means, described in connection with FIG. 3 and comprising the shunt resistor 27 and the voltage measuring means 28 or comprising the shunt resistor 47 and the voltage measuring means 48, is associated with each of the DC motors 21, 41. In this case, too, the line interruption during operation of the drive system 20 is identified by a comparison of the ascertained motor currents. As has likewise already been mentioned, the ascertained motor currents are fed to a computation unit, which is likewise not shown in any more detail in FIG. 4. Said computation unit then performs the described comparison of the motor currents in order to infer the line interruption or operation of the drive system 20 as intended from the comparison of the measured currents.

The ascertainment of the line interruption by the application of a defined voltage by means of the voltage determination apparatus described in connection with FIG. 3 in this case does not provide any usable results since in this case a voltage across the functioning DC motor can always be measured. The corresponding components are therefore crossed out in FIG. 4 for the purpose of illustration.

In the exemplary embodiment described in FIG. 4, too, the processing or knowledge of the motor rotational speed by the rotational speed determination apparatuses 32, 52 is not required to determine or identify a line interruption.

FIG. 5 shows an exemplary embodiment of an arrangement according to the invention for identifying an electrical line interruption of the drive system 20 already described. As has already become clear from the description of the preceding embodiments in accordance with FIGS. 3 and 4, the DC motors 21, 41 are mechanically coupled to one another by means of their drive shafts 22, 42 and transmissions 23, 43 having the part 58 that is to be driven, for example the tailgate 10. In contrast to the preceding exemplary embodiments, in the arrangement according to the invention, only a single rotational speed determination apparatus 32 is provided, which is provided at the drive shaft 22, for example. As already described, the rotational speed determination apparatus 32 comprises the magnetic pole wheel 33 and the associated Hall sensor 34, by means of which Hall sensor the magnetic field of the magnetic pole wheel 33 is evaluated. The signal (sn1) emitted by the Hall sensor 34 represents a piece of rotational speed information that is transmitted to the computation unit 70. Lines and the like required for this purpose are not illustrated for the sake of simplicity.

In the manner of the known arrangement of FIG. 4, the DC motors 21, 41 in the arrangement according to the invention are connected in parallel. This means that respective terminals of the DC motors 21, 41 are connected to one another directly. Some motor terminals of the DC motors 21, 41 are connected to a node 62, the other motor terminals of the DC motors 21, 41 are connected to a node 63. It is therefore sufficient to provide just one single driver 24, comprising the driver stages 25, 26, such that the two DC motors 21, 41 can be energized with the aid of the driver stages 25, 26 in order to make the part 58 that is to be driven rotate.

In the present exemplary embodiment, the current measuring apparatus, which is already described and comprises the shunt resistor 27 and the voltage measuring means 28, is interconnected between the driver output 25A of the driver stage 25 and the node 62. As a result, the current measuring means 27, can determine the summation current $I_{Sum}$ of the currents flowing in the DC motors 21, 41. The summation current $I_{Sum}$ is supplied as current information to the computation unit 70 for processing.

The arrangement furthermore comprises two voltage measuring means 60, 61. The voltage measuring means 60 is interconnected between the node 62 and a reference potential V0. The voltage measuring means 61 is interconnected between the node 63 and the reference potential V0. By means of the voltage measuring means 60, 61, it is possible to detect the terminal voltage $U_{KL}$ dropped across the motor terminals of the DC motors 21, 41, said terminal voltage being fed as voltage information to the computation unit 70 for processing.

The computation unit 70 is designed to ascertain a motor parameter $k_\omega$ for the drive system from the voltage information (terminal voltage $U_{KL}$), the current information ($I_{Sum}$) and the rotational speed information (rotational speed $\omega$). An electrical line interruption can be identified as a result. The equations of the simplified DC motor model are used for this purpose. Said equations are:

$$U_{KL} = U_G + I_a * R_a, \quad (1)$$

$$U_G = \omega * k_\omega, \quad (2)$$

In the equations (1) and (2), $U_{KL}$ is the already mentioned terminal voltage, $I_a$ is the motor armature current, which corresponds to half of the summation current $I_{Sum}$ during operation of the drive system as intended, $R_a$ is the armature resistance, $U_G$ is the generator motor voltage and $\omega$ is the motor rotational speed already mentioned. The generator motor voltage $U_G$ and the motor rotational speed $\omega$ are measured directly in this case. The armature resistance $R_a$ and the motor parameter $k_\omega$ are motor parameters that are specified directly in a respective motor datasheet or can be derived from the motor datasheet.

During regular operation of the drive system 20, the load is distributed equally across both motors such that the following applies for each motor $$I_a I_{Sum}/2 \quad (3)$$

The motor parameter $k_\omega$ can now be ascertained from these available measurement and motor data. To this end, the equations (1), (2) and (3) are reformulated to give:

$$k_\omega = \frac{U_{KL} - \frac{I_{Sum}}{2} \cdot R_a}{\omega} \quad (4)$$

During operation as intended, the motor parameter $k_\omega$ ascertained in accordance with this formula should be located within a defined tolerance range around the setpoint value derived from the datasheet. Said setpoint value $k_{\omega\_set}$ is, for example, stored in a memory 71 of the computation unit 70 such that a comparison of the actual motor parameter $k_\omega$ and the known setpoint value $k_{\omega\_set}$ of the motor parameter can be ascertained. In the case of a line interruption in which only one motor is energized, it is not half of the measured summation current that flows through the remaining active DC motor but the entire summation current $I_{Sum}$. For this reason, the actual motor parameter $k_\omega$ is therefore significantly lower than the setpoint value $k_{\omega\_set}$ of the motor parameter. It is therefore easy to identify whether there is a line interruption or a failure in one of the DC motors.

The setpoint value $k_{\omega\_set}$ can—as already described—be ascertained based on the motor data from the data sheet and stored in the memory 71. Alternatively, continuous determination can be carried out by the computation unit 70. For example, during production, the motor parameter $k_\omega$ can be measured and stored in the memory 71 as the setpoint value $k_{\omega\_set}$ based on a specific positive case.

In another alternative, proceeding from an actual value (for example a standard value), said actual value can be adjusted with each movement of the part 58 that is to be driven. If there is a great difference, a fault event can also be inferred therefrom. This results in aging and/or heating of the components of the drive system being taken into account.

LIST OF REFERENCE SIGNS

10 Tailgate
11 First actuator
11k End of the first actuator 11 connected to the vehicle body
11h End of the first actuator 11 connected to the tailgate
12 Second actuator
12k End of the second actuator 12 connected to the vehicle body
12h End of the second actuator 12 connected to the tailgate
15 Vehicle
16 Vehicle body
20 Drive system
21 DC motor
22 Drive shaft
23 Transmission
24 Driver
25 Driver stage
25A Output of the driver stage 25 (driver output)
26 Driver stage
26A Output of the driver stage 26 (driver output)
27 Shunt resistor
28 Voltage measuring means
29 Resistor
30 Resistor
31 Voltage measuring means
32 Rotational speed determination apparatus
33 Magnet
34 Sensor
41 DC motor
42 Drive shaft
43 Transmission
44 Driver
45 Driver stage
46 Driver stage
47 Shunt resistor
48 Voltage measuring means
49 Resistor
50 Resistor
51 Voltage measuring means
52 Rotational speed determination apparatus
53 Magnet
54 Sensor
58 Part that is to be driven, in particular tailgate 10
60 Voltage measuring means
61 Voltage measuring means
62 First node
63 Second node
70 Computation unit
71 Memory
$U_{KL}$ Terminal voltage
$k_\omega$ Motor parameter
$k_{\omega\_set}$ Setpoint value of the motor parameter
$R_a$ Armature resistance
$I_{Sum}$ Summation current
$\omega$ Rotational speed of the drive shaft
V0 Reference potential
V1 Supply potential

The invention claimed is:

1. An arrangement for identifying an electrical line interruption during operation of a drive system, comprising:
   two parallel-connected DC motors, which are mechanically coupled to one another by a part that is to be driven;
   a driver for driving the two parallel-connected DC motors; and
   a measuring device for detecting different electrical variables of the drive system;
   the measuring device comprising:
      a rotational speed determination apparatus for determining rotational speed of the two DC motors, wherein the rotational speed determination apparatus is configured to supply a piece of rotational speed information representing the rotational speed to a computation unit;

a current measuring apparatus for determining a summation current flowing into the two DC motors, wherein the current measuring apparatus is configured to supply a piece of current information representing the summation current to the computation unit; and a voltage determination apparatus configured to determine terminal voltage of the two DC motors, wherein the voltage determination apparatus is configured to supply a piece of voltage information representing the terminal voltage to the computation unit;

the computation unit is configured to ascertain a motor parameter $k_\omega$ for the drive system from the voltage information, the current information and the rotational speed information and to compare said motor parameter with a setpoint value $k_{\omega\_set}$ of the motor parameter $k_\omega$, wherein presence of the electrical line interruption to one of the two DC motors can be inferred from a result of the comparing.

2. The arrangement as claimed in claim 1, wherein the computation unit is configured to ascertain the motor parameter $k_\omega$ according to formula $$k_\omega = \frac{U_{KL} - \frac{I_{Sum}}{2} \cdot R_a}{\omega}$$

wherein $U_{KL}$ is the terminal voltage, $I_{Sum}$ is the summation current, $R_a$ is armature resistance of the DC motors and $\omega$ is the rotational speed.

3. The arrangement as claimed in claim 1, wherein the computation unit is configured to infer the presence of the electrical line interruption when the ascertained motor parameter $k_\omega$ is lower than the setpoint value $k_{\omega\_set}$ of the motor parameter.

4. The arrangement as claimed in claim 1, wherein the computation unit is configured to infer the presence of the operation of the drive system as intended when the ascertained motor parameter $k_\omega$ corresponds to the setpoint value $k_{\omega\_set}$ of the motor parameter or is within a prescribed tolerance range around the setpoint value.

5. The arrangement as claimed in claim 1, wherein the computation unit is configured to read out the setpoint value $k_{\omega\_set}$ of the motor parameter from a memory of the computation unit.

6. The arrangement as claimed in claim 1, wherein the setpoint value $k_{\omega\_set}$ of the motor parameter is a fixed, unchanging value.

7. The arrangement as claimed in claim 1, wherein the setpoint value $k_{\omega\_set}$ of the motor parameter is a value that is determined and adapted during operation of the drive system.

8. The arrangement as claimed in claim 1, wherein the current measuring apparatus comprises a measuring shunt and a first voltage measuring means for detecting the voltage dropped across the measuring shunt, wherein the measuring shunt is interconnected between a first node, at which respective first terminals of the two parallel-connected DC motors are connected, and a first driver output.

9. The arrangement as claimed in claim 1, wherein the voltage determination apparatus comprises a second voltage measuring means, which is coupled to a first node to detect a first voltage applied to the first node, and a third voltage measuring means, which is coupled to a second node to which respective second terminals of the two parallel-connected DC motors are connected to detect a second voltage applied to the second node, wherein the terminal voltage can be ascertained from the difference between the first and the second voltage.

10. The arrangement as claimed in claim 1, wherein the rotational speed determination apparatus comprises a single sensor at a drive shaft of the two DC motors.

11. The arrangement as claimed in claim 1, wherein the part that is to be driven is a hatch of a motor vehicle.

12. A method for identifying an electrical line interruption during operation of a drive system, which comprises:

two parallel-connected DC motors, which are mechanically coupled to one another by a part that is to be driven;

a driver for driving the two parallel-connected DC motors; and a measuring device for detecting different electrical variables of the drive system;

the method comprising:

at a rotational speed determination apparatus of the measuring device determining a rotational speed of the two DC motors and supplying a piece of rotational speed information representing the rotational speed to a computation unit;

at a current measuring apparatus of the measuring device determining a summation current flowing into the two DC motors and supplying a piece of current information representing the summation current to the computation unit;

at a voltage determination apparatus of the measuring device determining terminal voltage of the two DC motors and supplying a piece of voltage information representing the terminal voltage to the computation unit; and at the computation unit ascertaining a motor parameter $k_\omega$ for the drive system from the voltage information, the current information and the rotational speed information and comparing said motor parameter with a setpoint value $k_{\omega\_set}$ of the motor parameter, wherein presence of the electrical line interruption to one of the two DC motors is inferred from the result of the comparing.

13. The method as claimed in claim 12, wherein the computation unit ascertains the motor parameter $k_\omega$ according to formula $$k_\omega = \frac{U_{KL} - \frac{I_{Sum}}{2} \cdot R_a}{\omega}$$

wherein $U_{KL}$ is the terminal voltage, $I_{Sum}$ is the summation current, $R_a$ is armature resistance of the DC motors and $\omega$ is the rotational speed.

14. The method as claimed in claim 12, wherein the computation unit infers the presence of the electrical line interruption when the ascertained motor parameter $k_\omega$ is lower than the setpoint value $k_{\omega\_set}$ of the motor parameter.

15. The method as claimed in claim 12, wherein the computation unit infers the presence of the operation of the drive system as intended when the ascertained motor parameter $k_\omega$ corresponds to the setpoint value $k_{\omega\_set}$ of the motor parameter or is within a prescribed tolerance range around the setpoint value.

16. The method as claimed in claim 12, wherein the computation unit reads out the setpoint value $k_{\omega\_set}$ of the motor parameter from a memory of the computation unit.

* * * * *